United States Patent [19]

Chen et al.

[11] Patent Number: 4,490,211
[45] Date of Patent: Dec. 25, 1984

[54] LASER INDUCED CHEMICAL ETCHING OF METALS WITH EXCIMER LASERS

[75] Inventors: Lee Chen, Poughkeepsie; John R. Lankard, Mahopac; Gangadhara S. Mathad, Poughkeepsie, all of N.Y.

[73] Assignee: International Business Machines Corporation, Armonk, N.Y.

[21] Appl. No.: 573,452

[22] Filed: Jan. 24, 1984

[51] Int. Cl.³ .......................... C23F 1/02; B44C 1/22; C03C 15/00; C03C 25/06
[52] U.S. Cl. .................... 156/643; 156/345; 156/635; 156/646; 156/656; 156/664; 156/666; 219/121 LJ; 427/53.1
[58] Field of Search ............... 156/635, 638, 643, 646, 156/656, 664, 666, 345; 427/53.1; 219/121 L, 121 LH, 121 LJ, 121 FS, 121 LM

[56] References Cited

U.S. PATENT DOCUMENTS

| | | | |
|---|---|---|---|
| 3,364,087 | 1/1968 | Solomon et al. | 156/635 |
| 4,221,047 | 9/1980 | Narken et al. | 29/840 |
| 4,245,273 | 1/1981 | Feinberg et al. | 361/382 |
| 4,260,649 | 4/1981 | Dension et al. | 427/53.1 |
| 4,331,504 | 5/1982 | Chuang et al. | 156/635 |
| 4,332,999 | 6/1982 | Wittke | 219/121 LJ |

OTHER PUBLICATIONS

"A Fabrication Technique for Multilayer Ceramic Modules" by H. D. Kaiser et al., Solid State Technology/May 1972, pp. 35-40.
"Laser-Enhanced Chemical Etching of Solid Surfaces" by T. J. Chuang, IBM J. Res. Develop. vol. 26, No. 2, Mar. 1982, pp. 145-150.
"Surface Etching by Laser-Generated Free Radicals" by J. I. Steinfeld et al., Journal of the Electrochemical Society, vol. 127, No. 1, Jan. 1980, pp. 514-515.
"Laser-Induced Chemical Etching of Ferrites" by J. Addy et al., IBM Technical Disclosure Bulletin, vol. 25, No. 7A, Dec. 1982, p. 3256.
"Excimer Laser Update" by J. Hecht, Lasers & Applications, Dec. 1983, pp. 43-49.
"Ultrafast High-Resolution Contact Lithography with Excimer Lasers" by K. Jain et al., IBM J. Res. Develop. vol. 26, No. 2, Mar. 1982, pp. 151-159.
"Laser-enhanced gas-surface chemistry: Basic processes and applications" by T. J. Chuang, J. Vac. Sci. Technol. 21(3) Sep./Oct. 1982, pp. 798-806.

*Primary Examiner*—William A. Powell
*Attorney, Agent, or Firm*—T. Rao Coca

[57] ABSTRACT

Disclosed is a method of etching a metallized substrate by excimer laser radiation. The substrate is exposed to a selected gas, e.g., a halogen gas, which spontaneously reacts with the metal forming a solid reaction product layer on the metal by a partial consumption of the metal. A beam of radiation from an excimer laser, e.g. XeF laser operating at a wavelength of 351 nm or XeCl laser at 308 nm or KrF laser at 248 nm or KrCl laser at 222 nm or ArF laser at 193 nm or $F_2$ laser at 157 nm, is applied to the reaction product in a desired pattern to vaporize the reaction product and thereby selectively etch the metal with a high resolution.

10 Claims, 1 Drawing Figure

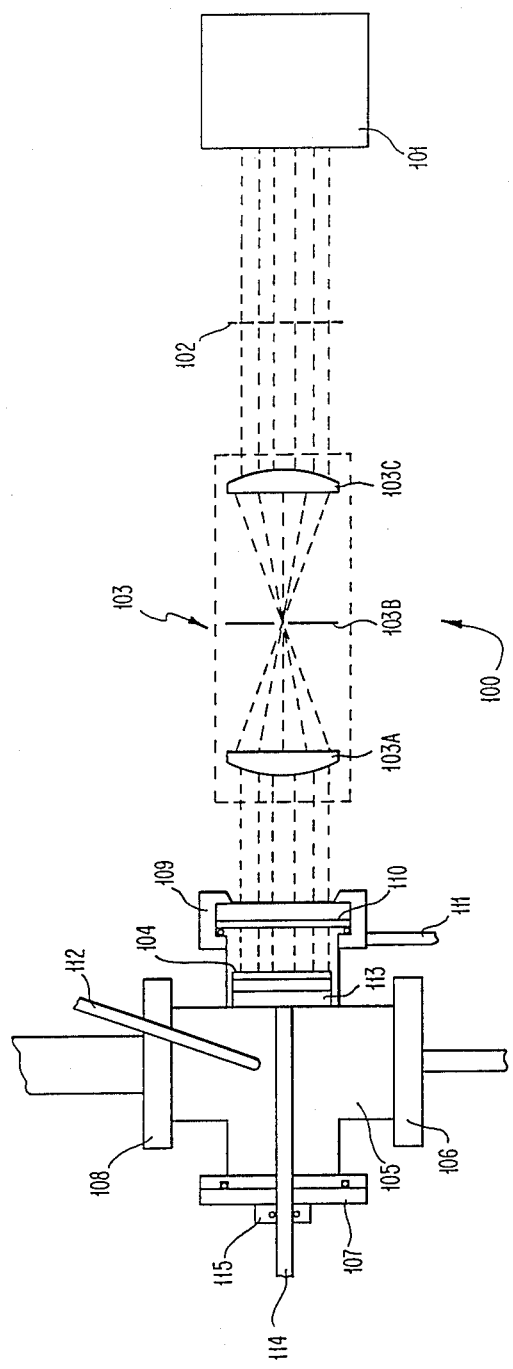

LASER INDUCED CHEMICAL ETCHING OF METALS WITH EXCIMER LASERS

DESCRIPTION

FIELD OF THE INVENTION

This invention concerns a method of radiation induced dry etching of a metallized substrate. More particularly, the invention concerns the use of a specially selected gas which reacts with the metal forming a solid reaction product which is capable of being removed when irradiated with a beam of radiation generated by an excimer laser.

CROSS REFERENCE TO RELATED APPLICATIONS

L. Chen et al patent application Ser. No. 573,451, filed simultaneously with this application, entitled "Laser Induced Dry Chemical Etching of Metals".

BACKGROUND OF THE INVENTION

The trend in electronics today is towards systems of ever increasing component density. Increased component density permits designers to achieve greater speed and complexity of system performance while maintaining system size at a minimum. Additionally, increased component density enables manufacturers to lower production costs owing to the economies that can be realized using integrated circuit processing.

The desire for increased component density has given rise to very large scale integrated circuit (VLSI). In such circuits, designers pack large numbers of electrical components onto individual integrated circuit chips. Subsequently, these chips are ganged on a substrate to form larger circuits and functional blocks of a system.

To facilitate the mounting of the high density circuit chips, designers have developed the so-called multilayer ceramic (MLC) substrate. The MLC substrate is well known and has been described in such articles as "A Fabrication Technique for Multilayer Ceramic Modules" by H. D. Kaiser et al, appearing in *Solid-State Technology*, May 1972, pp. 35–40.

An example of a semiconductor module including a multilayer ceramic substrate is given in U.S. Pat. No. 4,245,273 issued to Feinberg et al and assigned to the assignee of this application.

MLC manufacturers have found that substrate performance, particularly, the maximum circuit speed the substrate will sustain, can be increased by reducing the length of the thick film metal wiring built into the substrate to interconnect the chips. Designers have proposed to reduce interconnection wiring by replacing at least some of the MLC thick film circuits with multilayer thin film circuits. Particularly, designers have proposed to use thin film circuits at the MLC chip mounting surface. The thin film circuits are formed at the MLC chip mount surface as multiple layers of thin film metal separated by layers of insulation. The multiple metal layers are interconnected by vertical metallization which extends through holes commonly referred to as vias that are arranged in a predetermined pattern.

Because it is possible to make a line of smaller dimension, using thin film technology as compared with thick film technology, it is possible to fit more circuits in a substrate plane. Where higher circuit density per plane is achieved, fewer planes are required and accordingly the circuit wiring length interconnecting the multiple planes can be reduced. By shortening the plane interconnection metallization less circuit inductance and parasitic capacitance is present permitting the higher frequency performance. This technique for increasing frequency capability has come to be referred to as Thin Film Redistribution (TFR). An illustration of an MLC including a TFR structure is provided in U.S. Pat. No. 4,221,047 issued to Narken et al and assigned to IBM Corporation, the assignee of this invention.

While the size of TFR multilevel metallization structure is smaller than that of thick film, it is not as small as thin film metallization structure used on the chips. Because the TFR current is a combination of the currents supplied by the multiple chips, it is substantially greater than the chip current. The TFR metallization must therefore be of larger physical size than that of the chip to maintain current densities and associated heating at acceptable levels. Additionally, the dielectric separating the TFR metal layers is also thicker and of different composition. As taught in the above mentioned U.S. patents, copper is the metal most widely used for forming the metallization patterns. It is therefore obvious that copper etching is an essential process in both Thin Film Redistribution (TFR) and Metallized Ceramic Polyimide (MCP) technology and more generally for various packaging applications where there is a need to define wiring patterns in thick copper films.

Unfortunately, because TFR metallization structures are larger than those of an I.C. chip and because the materials are somewhat different, the thin film process techniques conventionally used for I.C. chip metallization fabrication such as the lift off etching technique and dry etching (plasma or reactive ion etching) cannot be easily used in making TFR structures. The lift off technique is complex and difficult to define thick films. Dry etching needs complex equipment and process steps involving inorganic masks such as MgO and $SiO_2$. Furthermore, dry etching is not accurately repeatable and controllable particularly in large batch processing.

Techniques of etching various materials at high etch rates using laser induced dry chemical etching have been reported in the literature. For example, Chuang in his article, "A Laser-Enhanced Chemical Etching of Solid Surfaces", *IBM Journal of Research and Development*, Vol. 26, No. 2, March 1982 reports that silicon and tantalum can be successfully etched by vibrational excitation of $SF_6$ using a $CO_2$ laser. In addition, Chuang notes the etching of silicon by dissociation of $SF_6$ using a $CO_2$ laser and the etching of silicon dioxide by dissociation of chlorine gas using an argon laser.

Reference is also made to the article entitled "Surface Etching by Laser-Generated Free Radicals" by Steinfeld et al, published in the *Journal of the Electrochemical Society*, Vol. 127, No. 1, January 1980, for a description of the etching of $SiO_2$ by the disassociation of $CF_3Br$ using a $CO_2$ laser and the etching of silicon nitride by the disassociation of $CF_2Cl_2$ and $CDF_3$ using a $CO_2$ laser.

Reference is also made to U.S. Pat. No. 4,260,649 which discloses a method and apparatus for chemical treatment of a silicon wafer wherein said wafer to be processed is exposed to a controlled gaseous atmosphere containing a gaseous constituent to be dissociated by laser radiation to produce a gaseous reactant product for reaction with a surface of the wafer. In this method the wavelength of the laser beam radiation is selected for splitting the desired bonds to produce only the desired reactant product without producing undesired by-products which could deleteriously interfere with the desired chemical reaction. As a specific example selective etching of a metal over silicon or metal over silicon dioxide by using gaseous $BCl_3$ at a few Torr pressure and irradiating the gas with a $CO_2$ laser of wavelength 10.6 μm to dissociate the $BCL_3$ to $BCl_2$ and Cl. The Cl component (and perhaps $BCl_2$) reacts with the metal to selectively etch the metal. Thus, in this method the surface to be etched is not directly irradiated with the laser beam.

SUMMARY OF THE INVENTION

The principal object of the present invention is to provide an improved method of selective laser induced chemical etching of a metallized substrate with high etch rates and superior resolution.

According to the present invention, the metallized substrate is mounted in a reaction chamber in which a vacuum of predetermined pressure is established. A selected gas which naturally forms a solid reaction product with the metal is introduced into the chamber. The gas will spontaneously react with the metal on the substrate and forms a solid reaction product thereon by partial consumption of the metal surface. The reaction product is selectively irradiated with a patterned beam of radiation from a pulsed excimer laser operating at a wavelength suitable for absorption by the reaction product. Wherever the laser radiation strikes the reaction product, due to thermal excitation and eventual vaporization, the reaction product is driven off exposing a new layer of the metal. The newly exposed layer will again react with the gas forming a new layer of reaction product which, in turn, is removed by irradiating with another excimer laser pulse. In this manner the metal is etched to a desired depth in a pattern conforming to the laser beam pattern.

In a specific example of the present process to etch a layer of copper, a convenient gas that can be utilized is chlorine. The reaction product formed in this situation is copper chloride. The excimer laser that is suitable for selective removal of copper chloride and thereby etch the copper can be the XeF laser operating at a wavelength of 351 nm, or XeCl laser at 308 nm, or KrF laser at 248 nm or, KrCl laser at 222 nm, or ArF laser at 193 nm or the $F_2$ laser at 157 nm.

BRIEF DESCRIPTION OF THE DRAWINGS

The above and other objectives and advantages of this invention will be better understood with reference to the following detailed description of the invention read in conjunction with the accompanying figure which is a diagrammatic representation of an apparatus for etching metals in accordance with the invention.

DETAILED DESCRIPTION OF THE PREFERRED EMBODIMENT

Basically, the present process involves formation of a thin layer of a solid reaction product on a metal surface by spontaneously reacting the metal with a selected gas and selectively irradiating the reaction product with a beam of radiation from a pulsed excimer laser having a wavelength which can be absorbed by the reaction product. Wherever the excimer laser radiation strikes, due to heating caused by absorption of the radiation, the thin layer of reaction product is vaporized and driven off exposing a fresh layer of metal. A new layer of reaction product is formed on the freshly exposed metal, as before, by reacting the metal with the gas. This new layer of reaction product, in turn, is removed by irradiating with a pulse of laser radiation. In this manner, the metal is etched.

The solid reaction product is formed by a partial consumption of the metal. In the areas of the metal which are not irradiated with radiation from the excimer laser the reaction product remains in tact until removal, at the termination of the laser etch process, by rinsing in a diluted chemical solution. Due to the selective nature of etching the metal, patterning thereof is possible using the excimer laser radiation.

A pulsed excimer laser is utilized in the present process because of its unique advantageous characteristics, which lend themselves to efficient laser etching of metals with few drawbacks. One advantage of excimer lasers for metal etching is the short pulse width, of the order of 15-30 nsec. The short pulse width enables the radiation to limit the heating to the thin layer of reaction product which is ultimately driven off. Thus, surface morphology will not be a concern at the end of the etch process. Another advantage is that the wavelength of excimer lasers matches with the absorption spectrum of the reaction product. Another advantage is that the excimer laser has poor temporal and spatial coherence, i.e. the excimer laser radiation has a spectrally broad band, and the phase relationship of the radiation is random. Consequently, a beam with reduced spatial coherence and reduced interference effects characteristic of the normal coherent laser radiation is obtained. Another advantage is the availability of excimer lasers with reasonably high energy per pulse in excess of one joule and pulse repetition rates of up to 1000 Hz.

An etching system for carrying out the present invention is as shown in the Figure. As illustrated in the Figure, system 100 includes a laser 101, a mask 102, an optical imaging system 103 and a metallized substrate that is desired to be etched 104 mounted in a reaction chamber 105. Laser 101 is a rare gas pulsed excimer laser which is capable of emitting a characteristic wavelength which matches the absorption wavelength of the reaction product. One commercially available laser for purposes of this invention is the Lambda Physik EMG 101 Model.

The mask 102 is of a conventional type comprising a UV grade quartz substrate having a patterned cromium film thereon. The mask 102 will be transparent to the laser light in the regions where there is no cromium film and opaque in the regions where the cromium is present. As a result, light from laser 101 will be transmitted by the mask 102 in a pattern corresponding to the transparent regions of the mask.

The imaging system 103 consists of a telecentric optics system having of two plano-convex quartz lenses 103a and 103c and an iris 103b. System 103 images the patterned beam of laser radiation emerging form mask 102 onto the metallized substrate 104 for etching in conformance with the patterned laser beam.

It will be appreciated that while the etching system shown in the Figure uses an image projection system to effectively project the patterned beam of laser radiation onto the substrate, the image system 103 can be dispensed with if a contact mask, placed in close proximity to the substrate 104, were utilized. An example of a contact mask which is conductive for practicing the present invention is a molybdenum plate having a desired pattern etched therethrough.

Referring to the Figure, the reaction chamber 105 is a standard off-the-shelf stainless steel tee fitted with a removable vacuum flange 106-109 on each of the four openings. Flange 106 is connected to a roughing pump (not shown) and flange 108 is connected to a turbine type vacuum pump (not shown). These pumps provide the necessary low pressure within the reaction chamber 105 during the etching process. Flange 109 is provided with a UV grade quartz window 110 for permitting the laser light to enter the chamber 105. The window is optically clear and distortion-free to ensure that the mask image projecting thereon will be transmitted without distortion to the substrate 104. Flange 109 is also provided with a tube 111 which permits introduction of reactive gas into the chamber 104. Flange 107 is filled with a shaft 114 passing through a vacuum seal 115. A sample holder 113 is mounted on the shaft 114 to accommodate the substrate to be etched 104. The shaft 114 enables movement of the substrate 104 toward or away from the window 110.

The reaction chamber 105 is additionally provided with a stainless steel tube 112 mounted near the center thereof. Tube 112 is connected to a capacitance type vacuum gauge to continuously monitor the pressure inside the chamber.

Having described an apparatus for carrying out the invention the actual etching process will now be described with specific reference to etching copper using chlorine. Turning to the Figure, the reaction chamber 105 is cleaned and baked out at a temperature of about 80° C., typically, by wrapping a heat tape around the four tubes of the tee. During this bake-out the vacuum pumps are turned on to ensure that all the unwanted gases such as water vapor are removed from the chamber. Following the bake-out, a substrate 104 having a copper layer thereon is introduced into the chamber and mounted on the holder 113 by utilizing a plastic glove bag, which is continuously purged with an inert gas such as argon, attached to the flange 107. The chamber 105 is then evacuated to less than $10^{-5}$ torr, valved off and subsequently chlorine gas is introduced, through tube 111, until a chamber pressure of about 5 torr is attained. The reaction chamber is held at this pressure for a few minutes to passivate the inside thereof. Thereafter, the pressure inside the chamber is adjusted to suit the etching process.

Chlorine gas introduced into the reaction chamber will spontaneously react with the copper layer on the substrate 104 and form a thin surface layer of copper chloride solid reaction product. The copper chloride is formed by diffusion of chlorine through the copper and consuming the copper. The reaction between copper and chlorine proceeds rapidly. The thickness of the copper chloride layer formed is a function of not only the reaction time (the period of exposure of copper to chlorine), temperature and chlorine gas pressure, but also the nature (i.e. density) of the copper layer. Chlorine tends to diffuse quickly through a rough and porous copper layer and rapidly convert the copper to copper chloride, whereas it tends to diffuse rather slowly through a dense copper layer. For example, in the case of porous copper (formed by electron beam evaporation on a ceramic substrate), the thickness of the copper chloride formed in a time of 0.1 sec. at a chlorine gas pressure of 250 millitorr and room temperature is about 500 nm.

Once the copper chloride reaction product has been formed, the next step is to selectively remove the reaction product by irradiating it with a pulse of excimer laser lasing at a wavelength suitable for absorption by the copper chloride. Excimer lasers that can be advantageously used include $F_2$ laser operating at a wavelength of 157 nm, ArF laser at 193 nm, KrCl laser at 249 nm, KrF laser at 248 nm, XeCl at 308 nm and XeF laser at 351 nm.

It will be appreciated that before irradiating the reaction product, the laser optics comprising the laser 101, mask 102 and image projection system 103 are carefully aligned, typically, by means of a helium-neon laser and focused with the aid of a fluorescent material such as reston, since excimer laser radiation is in the UV spectrum and is not visible to the eye, to the maximum resolution. Thereafter, the desired laser intensity in the range 8–10 MW/cm$^2$ and repetition rate 10–20 Hz are set.

When a pulse of excimer laser radiation strikes the copper chloride reaction product formed on substrate 104 in a pattern dictated by the projection mask 102, the copper chloride will, due to absorption of the radiation, undergo thermal and electronic excitation and, ultimately, vaporize thereby exposing a new layer of copper in accordance with the pattern in which the laser radiation irradiated the copper chloride. The copper chloride layer in the regions of the metallized substrate which were not irradiated remains unaffected. The newly exposed copper will react with the chlorine gas in the reaction chamber forming a nascent layer of solid copper chloride thereon. This nascent layer is once again irradiated with another pulse of excimer laser radiation and driven off. In this manner, the copper is etched layer by layer until the entire metal is etched through forming the desired conductor pattern.

Once the etching is complete, the metallized substrate 104 is removed from the reaction chamber and rinsed off in dilute ammonium hydroxide and deionized water to remove the reaction product remaining in the unetched portions of the copper.

The etch rate of copper is a function of several parameters including the temperature and pressure in the reaction chamber, the energy density, wavelength, pulse width and repetition rate of the excimer laser, and the density of the copper. Typically, using the XeCl excimer laser at 308 nm and energy density of 0.34 J/sq. cm. the etch rate at room temperature of a copper film (formed on a silicon substrate by electron beam evaporation technique) is in the range 50–250 nm/sec when the chlorine gas pressure in the reaction chamber is in the range 0.1–1.0 torr and the laser repetition range is in the range 1–50 Hz.

While the invention has been discussed with specific reference to etching copper using chlorine as the reactant gas, the invention is not so limited. Any other gas which is capable of spontaneously reacting with copper and forming a solid reaction product can be substituted in place of chlorine and the reaction product so formed is driven off by an excimer laser operating at a wavelength which corresponds to the absorption spectrum of the reaction product. Likewise, although the invention has been elaborated in terms of etching copper, it is well suited for etching other metals such as cromium, titanium, molybdenum, aluminum and stainless steel.

Etching of chromium by the present process is particularly noteworthy since MCL substrates having TFR multilevel metallization utilize a sandwich layer of chromium-copper-chromium formed on a silicon or ceramic substrate. The chromium layers are thin, typically, about 800 Å and the copper thickness is about 5000 nm. The present process conveniently lends itself to etching the chromium-copper-chromium sandwich layer in the same reaction chamber using the same reactant gas for etching both metals. For example, when chlorine gas is utilized, it will spontaneously react with chromium forming chromium chloride reaction product. The thickness of the chromium chloride reaction product will be considerably thinner than that of the copper chloride layer formed on copper, but it can be driven off by irradiating with an excimer laser pulse of the same wavelength as that used for driving off copper chloride. It will be appreciated that under identical conditions the etch rate of chromium is lower than that of copper. Typically, the etch rate of chromium by the KrF excimer laser operating at a wavelength of 248 nm, energy density of 200 mJ/sq. cm. and repetition rate of 10 Hz at a chlorine gas pressure in the reaction chamber of 300 millitorr and room temperature is 0.5 Angstroms/pulse. In the context of etching the TFR chromium-copper-chromium sandwich layer, the low etch rate of chromium is not a concern since the thickness of the chromium layer is considerably smaller than that of copper.

The present invention has several advantages over prior art wet etching. The invention dispenses with caustic chemicals characteristic of prior art techniques. Due to the unique optical qualities of the excimer laser beams and localized interaction of the laser beam with the reaction product, it is possible to etch extremely high resolution metal lines with near perfect straight walls thereby making the present process conducive for sophisticated pattern delineation at the packing level. Also because the etching chemistry is very localized, that is independent of apparatus dimensions, the present process lends itself very readily to scaling up.

While the invention has been particularly described with respect to the preferred embodiment thereof, it will be understood by those skilled in the art that various changes in form and detail may be made therein without departing from the spirit and scope of the invention.

We claim:

1. A method of radiation induced dry etching of a metallized substrate comprising the steps of:
   (a) mounting the substrate in a reaction chamber;
   (b) establishing a predetermined low pressure in the chamber;
   (c) controllably introducing a selected gas into the chamber to form a solid reaction product with the metal by a partial consumption of the surface of said metal; and
   (d) selectively removing the reaction product by applying a beam of excimer laser radiation and thereby selectively etching the metal.

2. The method as in claim 1 wherein said radiation is of a wavelength suitable for absorption by said reaction product.

3. The method as in claim 2 wherein said reaction product is removed by said radiation by thermal excitation and eventual vaporization.

4. The method as in claim 3 wherein said gas is halogen gas.

5. The method as in claim 4 wherein said gas is chlorine.

6. The method as in claim 5 wherein said metal is copper and said reaction product is copper chloride.

7. The method as in claim 5 wherein said metal is selected from a group consisting of chromium, titanium, aluminum, molybdenum, and stainless steel.

8. The method as in claim 6 or 7 wherein said excimer laser is selected from a group consisting of XeF laser operating at a wavelength of 351 nm, XeCl laser at 308 nm, KrF laser at 248 nm, KrCl laser at 222 nm, ArF laser at 193 nm and $F_2$ laser at 157 nm.

9. A method of radiation induced dry etching of a copper layer formed on a substrate comprising:
   (a) reacting said copper layer with a halogen gas forming a solid copper halide reaction product layer thereon by at least a partial consumption of said copper layer; and
   (b) selectively removing the copper halide, by vaporization, by applying, in a predetermined pattern, radiation from an excimer laser and thereby selectively etching the copper layer.

10. The method as in claim 9 wherein said excimer laser is selected from a group consisting of XeF laser operating at a wavelength of 351 nm, XeCl laser at 308 nm, KrF laser at 248 nm, KrCl laser at 222 nm, ArF laser at 193 nm and $F_2$ laser at 157 nm.

* * * * *